United States Patent
Skinner et al.

(10) Patent No.: US 10,060,965 B1
(45) Date of Patent: Aug. 28, 2018

(54) METHOD AND APPARATUS FOR EVALUATING ETHERNET POWERED DEVICES

(71) Applicant: Sifos Technologies, Inc., Tewksbury, MA (US)

(72) Inventors: John H. Skinner, Billerica, MA (US); Kendrick R. Bennett, Tewksbury, MA (US); Peter G. Johnson, Andover, MA (US)

(73) Assignee: Sifos Technologies, Inc., Tewksbury, MA (US)

(*) Notice: Subject to any disclaimer, the term of this patent is extended or adjusted under 35 U.S.C. 154(b) by 719 days.

(21) Appl. No.: 14/489,792

(22) Filed: Sep. 18, 2014

(51) Int. Cl.
*G01R 31/08* (2006.01)
*G01R 21/06* (2006.01)
*G01R 21/133* (2006.01)

(52) U.S. Cl.
CPC ........... *G01R 31/086* (2013.01); *G01R 21/06* (2013.01); *G01R 21/133* (2013.01)

(58) Field of Classification Search
CPC ..... G01R 31/086; G01R 21/06; G01R 21/133
See application file for complete search history.

(56) References Cited

U.S. PATENT DOCUMENTS

| 7,162,377 | B2 | 1/2007 | Amrod et al. | |
|---|---|---|---|---|
| 2008/0252307 | A1* | 10/2008 | Schindler | G06F 1/266 324/713 |
| 2010/0007334 | A1* | 1/2010 | Apfel | H04L 12/10 324/123 R |
| 2010/0100750 | A1* | 4/2010 | Bobrek | H04L 12/10 713/300 |
| 2011/0258464 | A1* | 10/2011 | Gammel | G06F 1/266 713/300 |
| 2015/0194906 | A1 | 7/2015 | Yedinak et al. | |

OTHER PUBLICATIONS

IEEE 802.3at-2009, Part 3: Carrier Sense Multiple Access with Collision Detection Access Method and Physical Layer Specifications IEEE Computer Society, Oct. 30, 2009, All pages.*
IEEE Std 802.3at-2009, Amendment to IEEE Std 802.3-2008: CSMA/CD, 33.3.7 PD Power, 2009, pp. 3.

* cited by examiner

*Primary Examiner* — Un C Cho
*Assistant Examiner* — Jeremy Costin
(74) *Attorney, Agent, or Firm* — Chapin IP Law, LLC

(57) ABSTRACT

An apparatus to test an Ethernet powered device includes a processor including a power negotiation supervisor, a DC power source, a first interface having an Ethernet medium dependent interface and a coupling circuit that inserts DC power onto one or more wire pairs of the first interface. The apparatus further includes a first bridging circuit, a measuring circuit to measure characteristics of DC power delivered to Ethernet powered device. The DC power source is configurable over a range of voltage levels including a plurality of operating voltages which are applied to the Ethernet powered device and the power negotiation supervisor processes power negotiation protocol messages.

20 Claims, 9 Drawing Sheets

METHOD AND APPARATUS FOR EVALUATING ETHERNET POWERED DEVICES

FIELD OF THE INVENTION

This invention relates generally to instrumentation for testing of network products and more specifically to testing of Ethernet powered devices.

BACKGROUND

Ethernet is an internationally recognized standard for communications between networked equipment, which is described in the IEEE 802.3 standard. Power over Ethernet is described for the Ethernet MDI covering multi-conductor twisted pair cabled links.

A Power over Ethernet (PoE) system includes power-sourcing equipment (PSE) and at least one powered device, referred to herein as an Ethernet Powered Device (EPD). The EPD is connected to the PSE through standard network cables, which transfer both power and data communications.

The 802.3 IEEE Standard provides guidelines and requirements for PoE covering PSE and EPD design. This standard includes limits for PSE's and EPD's that address EPD detection by the PSE, power classification of the EPD, and powered operating characteristics. The updated 802.3 IEEE Standard 802.3at expanded the physical layer classification to include Two-Event classification and it added data-link classification. PSE's and Class 4 EPD's with these capabilities are referred to as Type 2. Two-Event classification and data-link classification protocols include mutual identification, where an EPD and a PSE may both learn the other's Type and power requirements and may adjust power consumption or allocation accordingly.

In order for the higher power levels of Class 4 under 802.3at to be used, one of the two classification protocols must first enable the higher power level. Two-event classification has specified timings and two class-pulse components that are used by the PSE to both classify an EPD and to indicate to the EPD that full class 4 power will be available from the PSE. If a PSE does not provide two event classification, this indicates that the PSE is not allowing higher power, which could occur if the PSE is Type 1, or if it isn't able to supply the higher power, or it might only allocate higher power via the Data link power classification. Data-Link Classification is a power negotiation protocol, which provides power allocation adjustment capability, based upon communications exchanged between a PSE and an EPD. 802.3at specified power over two of the 4 pairs present in most Ethernet twisted pair connections. 802.3bt will add 4 pair powering and higher power levels. Classification protocols may also be introduced and/or extended.

When an EPD is powered by a PSE, the power consumption is subject to minimum and maximum power level limits as determined by the power classification. Associated with these limits are timings, where peak, average, and minimum power consumption levels are timing dependent. For instance, an average power is based upon 1-second averaging. An EPD's power consumption can be highly dependent upon operating state or activity. This can complicate the testing of EPD's for compliance and for determining power classification requirements, particularly for data-link classifications, where the settings may be of a much higher resolution than physical layer classifications. The IEEE 802.3 clause 33, Power over Ethernet technology is well established and widely deployed in devices operating on local area networks. The popularity of these devices is related to the abundance of low cost equipment and easily installed structured cabling components utilized to provide connectivity and power to networked devices.

Assessing the physical layer performance characteristics of an IEEE 802.3 clause 33 is an important step in the development and manufacture of Ethernet powered devices because it provides requirements for the safety and interoperability of such devices. Because of the cost and complexity of traditional physical layer testing methods and solutions, many producers of products with one or more Ethernet ports rely on commercial Ethernet power sourcing and/or powered device equipment for assessing such devices.

However, interoperability testing offers very limited parametric insight meaning it cannot assure tested devices will perform properly under all network interface conditions. As a general matter in testing Ethernet powered devices, the assessment of device performance is a challenging task owing to the need to precisely stimulate the device while measuring detection and classification parameters and power consumption over various operating conditions. Although the concept of powering devices over network cabling is simple, testing the EPD functionality is complex.

Similarly, device operation by the test equipment is impractical owing to the fact that some of the devices are operationally complex and may require expensive and complex support equipment to place the device into an operational mode. The task of parametrically testing Ethernet powered devices using conventional means has been expensive, laborious, and invasive, often defying highly automated approaches. For this reason, the network equipment industry often relies solely on interoperability testing to qualify interface performance.

SUMMARY

Configurations disclosed herein substantially overcome the shortcomings of conventional testing methods. In particular, a POE test solution as disclosed herein provides a method of comprehensively testing Ethernet powered devices which operate under IEEE 802.3 clause 33 standards.

A technique to test an Ethernet powered device includes establishing a connection between the Ethernet powered device and a diagnostic powering device, applying power to the Ethernet powered device and supervising power negotiation between the diagnostic powering device and the Ethernet powered device including processing at least one power request message from the Ethernet powered device. The technique further includes measuring electrical parameters of the Ethernet powered device in response to applying power to the Ethernet powered device, a power negotiation or configuring an operational state of the Ethernet powered device configuring an operational state of the Ethernet powered device. With such a technique, measurements of EPD performance can be carried out in an operational network where the power characteristic of the EPD can be measured and monitored and the EPD can be controlled. By using various stimuli and measuring the results, such a technique facilitates the use of automated testing in contrast to solely using interoperability testing.

In one embodiment, applying power from the diagnostic powering device includes providing at least one predetermined voltage level, providing a plurality of predetermined operating voltage levels to operate the Ethernet Powered Device and applying the at least one predetermined voltage level and the plurality of predetermined operating voltage levels in common mode to the Ethernet powered device between at least two wire pairs. In yet another embodiment, providing a predetermined voltage level includes providing at least one predetermined voltage level for sensing detection characteristics of the Ethernet Powered Device or providing at least one predetermined voltage level for sensing classification characteristics of the Ethernet Powered Device. Additionally, these embodiments can test "finished product" interfaces and are not reliant on invasive connections or specialized test modes. Similarly, these embodiments may sequence the predetermined voltage level and the plurality of predetermined operating voltage levels to a wire pair in at least one of a positive polarity configuration and a negative polarity configuration.

In another embodiment, supervising the power negotiation includes receiving an initial power demand from the Ethernet powered device, responding to the initial power demand from the Ethernet powered device authorizing an initial power demand or rejecting the initial power demand, receiving a refined power demand from the Ethernet powered device, responding to the refined power demand authorizing the refined power demand, rejecting the refined power demand or altering the refined power demand.

In yet another embodiment configuring the operational state of the Ethernet powered device includes configuring a data transmission rate at the Ethernet powered device, forwarding a configuration message from a remote network device to the Ethernet powered device and receiving and forwarding information messages from the Ethernet powered device to the remote network device.

In another embodiment measuring electrical parameters includes measuring at least one power consumption sample of the Ethernet powered device and comparing the power consumption sample of the Ethernet powered device to a negotiated limit for maximum instantaneous peak power consumption, comparing the power consumption sample of the Ethernet powered device to a negotiated limit for maximum transient impulse power consumption, comparing the power consumption sample of the Ethernet powered device to a negotiated limit for maximum average power consumption, comparing the power consumption sample of the Ethernet powered device to a negotiated limit for maximum transient impulse duty cycle and comparing the power consumption sample of the Ethernet powered device to a predetermined limit for minimum power consumption.

An exemplary apparatus for testing an Ethernet powered device includes a processor including a power negotiation supervisor, a DC power source controllably coupled to the processor, a first bridging circuit coupled between the processor and a first interface, the first interface having an Ethernet medium dependent interface connectable to the Ethernet powered device and a coupling circuit that inserts DC power onto one or more wire pairs of the first interface. The apparatus further includes a measuring circuit coupled to the processor to measure characteristics of DC power delivered to Ethernet powered device through the first interface. In this apparatus, the DC power source is configurable over a range of voltage levels including a plurality of operating voltages applied to the Ethernet powered device and the power negotiation supervisor generates Ethernet messages associated with a power negotiation protocol and decodes Ethernet messages associated with the power negotiation protocol. Such an apparatus removes operational complexity from the diagnostic powering device by coupling a remote network device to the EPD under test. By applying a plurality of operating voltages to the Ethernet powered device, tests can be performed and measurements can be taken that are not possible with conventional interoperability testing.

In a further embodiment the first interface comprises an Ethernet PHY and the processor configures a link data rate of the Ethernet powered device. In another embodiment, the coupling circuit connects DC power in at least one of a positive polarity and a negative polarity to at least one wire pair with reference to at least a second wire pair. In still another embodiment, the apparatus further includes a second bridging circuit coupled between the first interface and a second interface, the second interface having an Ethernet medium dependent interface and the second bridging circuit transfers configuration messages from a remote network device to the Ethernet powered device and transfers information messages from the Ethernet powered device to the remote network device; and the remote network device controls at least one operational state of the Ethernet powered device.

In another embodiment, the first bridging circuit transfers at least one protocol message from the processor to the Ethernet powered device, transfers the at least one protocol message from the Ethernet powered device to the processor and at least one protocol message is utilized to supervise DC power consumption of the Ethernet powered device.

In yet another embodiment, the measuring circuit includes a current sampler coupled to at least one wire pair and in either voltage polarity, a voltage sampler coupled to on at least one wire pair and in either voltage polarity, a circuit for initiating sample collection based on the DC power source configuration or an interval timer to measure an interval of a voltage change between predetermined voltage levels. In yet another embodiment, the current sampler is configured to measure a resistive detection signature of the Ethernet powered device and a classification signature of the Ethernet powered device.

In another embodiment, the apparatus further includes a power consumption sampler coupled to the current sampler to receive a current sample and coupled to the voltage sampler to receive one voltage sample. The power consumption sampler can include a power sample processor which generates from the at least one current sample and the at least one voltage sample: a maximum instantaneous peak power consumption, a maximum transient impulse power consumption, a maximum and minimum average power consumption, a maximum transient impulse duty cycle; and a minimum power.

In a further embodiment, the first bridging circuit separates at least one Power-over-Ethernet link layer negotiation message from LAN traffic between the Ethernet powered device and the apparatus for testing the Ethernet powered device. In another embodiment, the power negotiation supervisor configures at least one Ethernet message that deviates from valid power negotiation protocols in message content or message timing.

A computer readable storage medium for tangibly storing thereon computer readable instructions includes instructions for testing an Ethernet powered device including establishing a connection between the Ethernet powered device and a diagnostic powering device, applying power to the Ethernet powered device, supervising power negotiation between the diagnostic powering device and the Ethernet powered device including processing at least one power request message from the Ethernet powered device, measuring electrical parameters of the Ethernet powered device in response to at least one of applying power to the Ethernet powered device, a power negotiation and configuring an operational state of the Ethernet powered device.

Other arrangements of embodiments disclosed herein include software programs to perform the method embodiment steps and operations summarized above and disclosed in detail below. More particularly, a computer program product is one embodiment that has a computer-readable medium including computer program logic encoded thereon that when performed in a computerized device provides associated operations providing test systems explained herein. The computer program logic, when executed on at least one processor with a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), floppy or hard disk or other media such as firmware or microcode in one or more ROM or RAM or PROM chips or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the invention. Embodiments of the system can be distributed between many software processes on several data communications devices, or all processes could run on a small set of dedicated computers or on one computer alone.

It is to be understood that the embodiments of the invention can be embodied, as software and hardware, or as hardware and/or circuitry alone, such as within a DPD device. The features of the invention, as explained herein, may be employed in a DPD and/or software systems for such devices. The embodiments disclosed herein, may be employed in software and hardware systems such as those manufactured by Sifos Technologies Inc. of Tewksbury Mass.

Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways. Note also that this Summary section herein does not specify every embodiment and/or incrementally novel aspect of the present disclosure or claimed invention. Instead, this Summary only provides a preliminary discussion of different embodiments and corresponding points of novelty over conventional techniques. For additional details and/or possible perspectives (permutations) of the invention, the reader is directed to the Detailed Description section and corresponding figures of the present disclosure as further discussed below.

BRIEF DESCRIPTION OF THE DRAWINGS

The foregoing and other objects, features and advantages of the invention will be apparent from the following more particular description of embodiments of the methods and apparatus for testing network interfaces, as illustrated in the accompanying drawings and figures in which like reference characters refer to the same parts throughout the different views. The drawings are not necessarily to scale, with emphasis instead being placed upon illustrating the embodiments, principles and concepts of the methods and apparatus in accordance with the invention.

DETAILED DESCRIPTION

Embodiments disclosed herein provide instruments and processes for testing of Ethernet powered devices. In one embodiment, a power negotiation supervisor and bridging circuits are provided to allow the test instrument to control the power negotiation while remote network devices configure and/or change the operational states of the Ethernet powered device under test. In addition the test instrument includes a configurable DC power source which applies several operational voltages to the Ethernet powered device under test. This differs from conventional operation of an Ethernet powered device which receives a single operational output voltage from power sourcing equipment.

Figure 1:
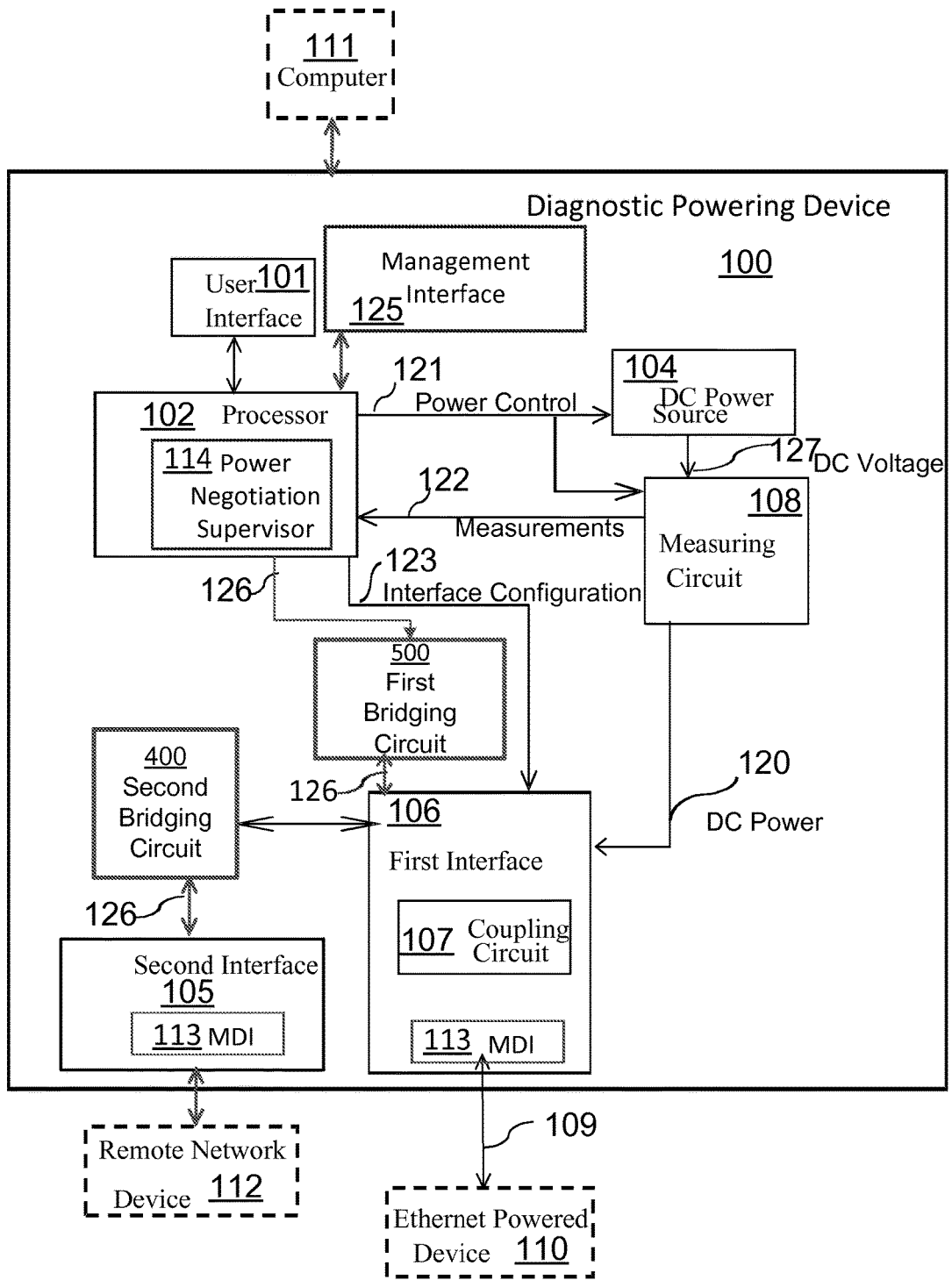
FIG. 1 is a block diagram of an apparatus for testing an Ethernet powered device in accordance with embodiments disclosed herein.

Referring now to FIG. 1, a diagnostic powering device (DPD) 100 for testing an Ethernet powered device 110 (EPD) includes a processor 102 having a power negotiation supervisor 114, a DC power source 104 controllably coupled to the processor 102 and a first interface 106 coupled to the processor. The first interface 106 includes an Ethernet medium dependent interface 113 connectable to the Ethernet powered device 110 and a coupling circuit 107. The DPD 100 further includes a first bridging circuit 500 coupled between the processor 102 and the first interface 106, a measuring circuit 108 coupled to the processor, a second bridging circuit 400 coupled between a second interface 105 and the first interface 106. The DPD 100 also includes a DC power source 104 and a measurement circuit 108 configured and controlled by the processor 102. The DC power source 104 is configurable over a range of voltage levels including multiple operating voltages which are applied to the EPD 110. EPDs 110 can operate over a range of input voltages which are dependent upon PSE output voltages, which may be fixed within an allowed range for each PSE and dependent upon voltage drops over cabling. It is important to test EPDs 110 over the full range of possible voltages that occur.

EPDs are generally constant DC power consumers over a wide range of operating voltages. A PSE is allowed to source DC voltage between 44V or 50V and 57V. After cable losses (e.g., voltage drops occurring in a one hundred meter, Category 3 or Category 5 cable), the voltage may ranges, for example, between 36V and 57V. So EPD power draw characteristics should and must be evaluated over that range of input voltages since PSEs manage EPD's (and negotiate power) based on predetermined power consumption, regardless of voltage.

In some embodiments, PSEs are constructed with fixed commercial DC power supplies that output voltages in at approximately 48 VDC or 54 VDC. These voltage levels determine the voltage sourced onto the cable when powering EPD's. The IEEE specification specifies that the voltage should not go below 44 VDC or 50 VDC, depending upon the PSE Type. So for example, while the DPD 100 could be used to test the EPD 110 power characteristics at 36 VDC, a conventional compliant PSE cannot test, the EPD 110 at non-standard voltages without somehow simulating various voltage attenuation levels.

The DPD 100 further includes a management interface coupling the processor 102 to an external computer 111.

In operation the DPD 100 configures and controls the DC power source 104, the measuring circuit 108, the first interface 106, supervision of power negotiation protocol with the Ethernet powered device 110, processing of measurements from the measurement circuit 108, processing of commands and queries from a management interface 125 with a computer 111, response to commands and queries from a local user interface 101, and display of status conditions to a local user interface 101. In one embodiment of the DPD 100, the processor 102 is a single chip microcontroller, though other embodiments of a DPD 100 with more distributed processing functions are possible.

The management interface 125 is a data communications interface utilized to manage the DPD 100 from a computer 111. In one embodiment of the DPD 100, the management interface 125 includes a Universal Serial Bus (USB) interface, though other interface technologies including but not limited to Ethernet and serial RS-232 are possible embodiments for the purposes of managing the DPD 100. Given adequate real-time bandwidth of the management interface 125, processing functions running on the processor 102 can be distributed between the processor 102 and a computer 111 and user interface functions can be distributed among the management interface 125, the processor 102 and the computer 111.

In operation in one embodiment, under control of the processor the coupling circuit 107 inserts DC power onto one or more wire pairs of the first interface 106 which is directed to the EPD 110, the measuring circuit 108 measures characteristics of DC power delivered to EPD 110 device through the first interface 106. In other tests, the power negotiation supervisor 114 generates Ethernet messages associated with a power negotiation protocol and decodes Ethernet messages associated with the power negotiation protocol. The user interface 101 provided by the management interface 125 includes push buttons or equivalent hardware/software controls to operate features of the DPD 100 and may also include of display elements that include at least one of an LED indicator and a LCD display to convey status information and measurement results to users. In another embodiment, the user interface is a graphical user interface.

The first interface 106 is provided as the testing interface between the DPD 100 and the EPD 110. The connection between the DPD 100 and the EPD 110 is made using a cable 109, here for example an Ethernet cable. In an embodiment where the EPD 110 is an IEEE 802.3 clause 33 compliant powered device, the Ethernet cable 109 is a cable described by the ANSI/TIA/EIA-568 standard and the first interface 106 is an Ethernet twisted pair interface supporting at least one of 10Base-T, 100Base-Tx, and 1000Base-T link rates.

The first interface 106 includes a coupling circuit 107 that is used to feed DC power 120 onto one or more wire pairs in the Ethernet cable 109 with one or more voltage polarities. A typical embodiment of the coupling circuit 107 includes at least one isolation transformer per wire pair with a primary side center tap into which DC power is coupled, though other arrangements are possible. The first interface 106 processes an interface configuration 123 from the processor 102. One aspect of the interface configuration 123 establishes specific modes of operation for the first interface 106. In an Ethernet embodiment of the DPD 100, these modes include at least one of 10Base-T, 100Base-Tx, and 1000Base-T. Other modes including Ethernet auto-negotiation for link duplex, link polarity (MDI vs. MDI-X), and auto-negotiation may also be included in interface configuration 123.

The first interface 106 transmits Ethernet data packets 126 between packet bridging circuits 103 and the EPD 110. The packet bridging circuits 103 sort and route Ethernet data packets 126 between a second interface 105, the first interface 106, and the processor 102. The second interface 105 provides a means for a remote network device 112 to communicate with the EPD 110 via the packet bridging circuits 103 and the first interface 106. In one embodiment of a DPD 100, the second interface is an Ethernet interface with capability to configure for at least one of 10Base-T, 100Base-Tx, and 1000Base-T. The DC power source 104 includes circuits to provide a variety of DC voltages 127 suitable for at least one of; detecting, classifying, and powering Ethernet Powered devices 110. DC voltages 127 produced include at least one of a single static voltage level, a sequence of discrete predetermined voltage steps, a slowly increasing voltage over time, a slowly decreasing voltage over time, and a series of operational voltages. In an embodiment of 802.3 clause 33 testing, operational voltages may include fixed or variable voltages for testing detection parameters in the range of 2.8V to 10V; for testing classification parameters in the range of up to at least 20.5V; and for testing power consumption in the range of 37V to 57V. DC voltages 127 are also defined to include any voltage that is developed from a fixed current source. The DC power source 104 is managed by the processor 102 using power control 121 configurations. In an embodiment of the DC power source 104 where the EPD 110 is an IEEE 802.3 clause 33 compliant powered device, the DC power source 104 ranges from 0 to 60 VDC. The DC power source 104 also ranges from 0 to at least 350 mA. No particular upper bound for current sourcing capacity is implied, however.

A measuring circuit 108 receives the DC voltages from the DC power source 104 and transfers those voltages as DC power 120 to the first interface 106. The measuring circuit 108 produces measurements 122 of that DC power 120 wherein the measurements 122 includes of at least one of electrical current, voltage, and time interval. Measurements 122 are then passed to the processor 102 for further processing. Measurements 122 include either discrete samples or continuous streams of samples. Further processing of measurements by the processor 102 may include calibration corrections and real-time computation of electrical power from voltage and current samples.

The DPD provides results of testing to the user. The results are provided in reports (e.g., an spreadsheet with a listing of parameters and comparison of results to nominal parameters), continuous or stop-on-fail monitoring in the form of a graphical and/or text interface of results, and/or a pass-fail indication for a test which includes a set of requirements determined by the user. The DPD results may be stored on storage media for future access and/or additional analysis.

Figure 2:
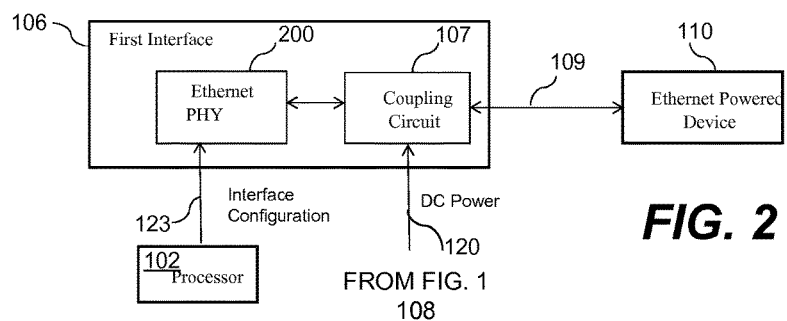
FIG. 2 is a block diagram of a first interface including a coupling circuit of the apparatus FIG. 1.

Now referring to FIG. 2, in one embodiment the first interface 106 includes an Ethernet physical layer implementation (PHY) 200 initialized by an interface configuration 123 provided by the processor 102. In operation, the processor 102 optionally configures a link data rate of the EPD 110. In an embodiment of the first interface 106 where the EPD 110 is an IEEE 802.3 clause 33 compliant powered device, the Ethernet PHY 200 supports at least one of 10Base-T, 100Base-Tx, and 1000Base-T link modes. In this embodiment, the Ethernet PHY 200 is coupled by isolation transformers in a coupling circuit 107 to an Ethernet cable 109 using methods known in the art.

Figure 3:
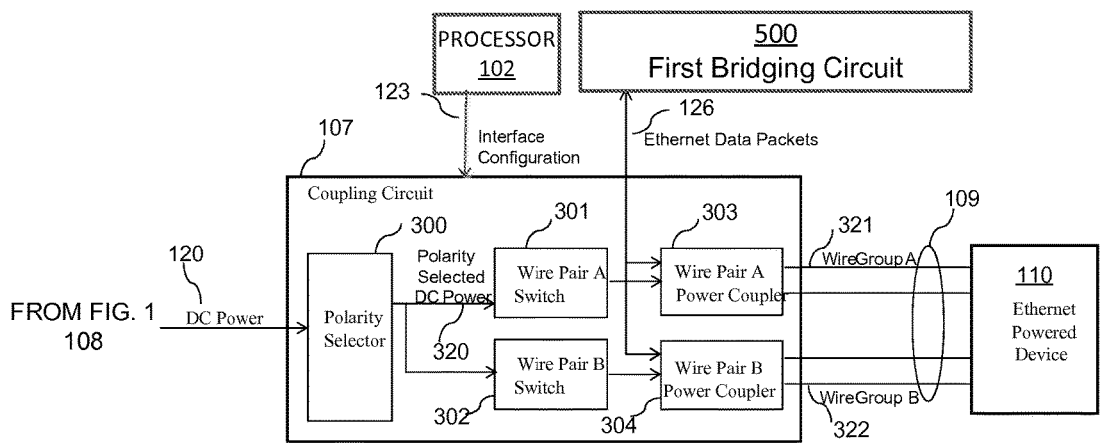
FIG. 3 is a block diagram of the coupling circuit of FIG. 2.

FIG. 3 shows further details of the coupling circuit 107 which includes a polarity selector 300 coupled to wire pair switches 301 and 302 which are coupled to wire pair power couplers 303 and 304, respectively. In operation, the coupling circuit 107 connects DC power in at least one of a positive polarity and a negative polarity to at least one wire pair 303 with reference to at least the second wire pair 304. DC power 120 is injected into the coupling circuit in the form of a fixed polarity voltage and current. The polarity selector 300 then determines whether the incoming polarity is maintained or reversed thus producing polarity selected DC power 320 for eventual insertion into one or more wire pairs of the Ethernet cable 109. Wire pair A switch 301 determines if the polarity selected DC power 320 will be applied onto a first set of two wire pairs, wire group A 321, within the Ethernet cable 109. Wire pair B switch 302 determines if the polarity selected DC power 320 will be applied onto a second set of two wire pairs, wire group B 322, within the Ethernet cable 109. In an embodiment where the EPD 110 is an IEEE 802.3 clause 33 compliant Ethernet powered device, wire group A 321 corresponds to Alternative A pairs and wire group B 322 corresponds to Alternative B pairs as described in IEEE 802.3 clause 33. The polarity selector 300, wire pair A switch 301, and wire pair B switch 302 are configured using the interface configuration 123.

Figure 4:
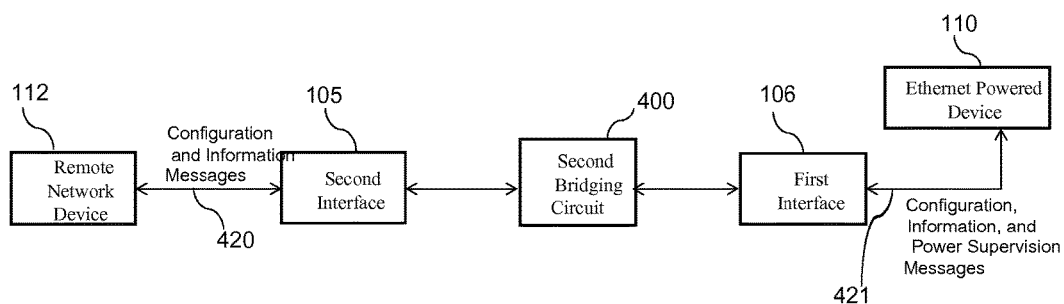
FIG. 4 is a block diagram of the apparatus of FIG. 1 connected to a remote network device.

Now referring to FIG. 4, the second bridging circuit 400 is coupled between the first interface 106 and a second interface 105. In one embodiment, the second bridging circuit 400 functions similar to a network switch. The second interface includes an Ethernet medium dependent interface (MDI) 113. In operation the second bridging circuit 400 transfers configuration messages from the remote network device 112 to the Ethernet powered device 110 and transfers information messages from the Ethernet powered device 110 to the remote network device 112. In one embodiment, this configuration removes the necessity for the DPD 100 to configure and operate the EPD 110. The remote network device 112 controls at least one operational state of the Ethernet powered device. The second bridging circuit 400 communicates configuration and information messages 420 that pass between the remote network device 112 and the Ethernet powered device EPD 110

In one embodiment, configuration and information messages 420 are generally formatted as Ethernet data packets 126 and are a subset of the configuration, information, and power supervision messages flowing between the first interface 106 and the EPD 110. It is understood, that for some EPDs 110 the configuration and operational control can be handled by the DPD 100 and processor 102.

Figure 5:
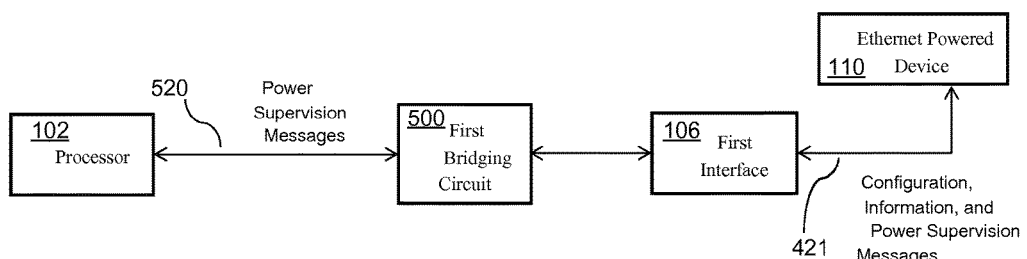
FIG. 5 is a block diagram of the apparatus of FIG. 1 connected to an Ethernet powered device.

Now referring to FIG. 5, the first bridging circuit 500 is coupled between the processor 102 and the first interface 106. In one embodiment, the first bridging circuit 500 functions similar to a network switch bridging the port and the processor. In operation the first bridging circuit transfers at least one link layer negotiation protocol message from the processor to the Ethernet powered device and transfers the at least one protocol message from the Ethernet powered device to the processor. The protocol message is utilized to supervise the DC power consumption of the Ethernet powered device. The first bridging circuit 500 communicates all power supervision messages 520 that pass between the processor 102 and the EPD 110. Power supervision messages 520 are generally formatted as Ethernet data packets 126 and are a subset of the Configuration, information, and power supervision messages flowing between the first interface 106 and the EPD 110.

Figure 6:
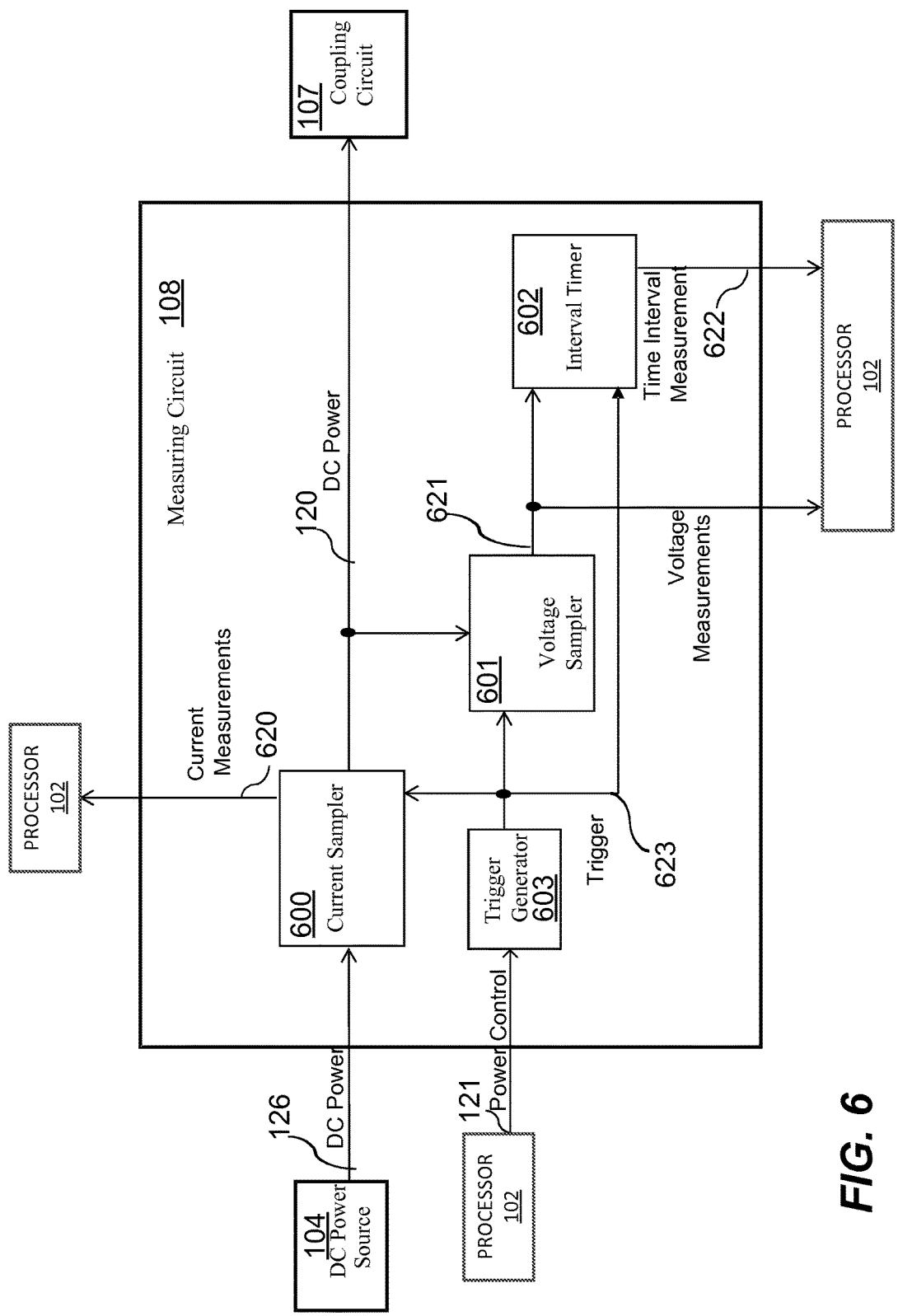
FIG. 6 is a block diagram of a measuring circuit of the apparatus of FIG. 1.

Details of the measuring circuit 108 are shown in FIG. 6. An exemplary measuring circuit 108 includes a current sampler 600, a voltage sampler 601, a trigger generator 603 and an interval timer 602. The current sampler 600 is coupled to the DC power source 104, the trigger generator 603, the voltage sampler 601 and provides current measurements 620 to the processor 102. The voltage sampler 601 is coupled to the trigger generator 603, the interval timer 602 and the DC Power output from the current sampler 600. The voltage sampler 601 provides voltage measurements 620 to the processor 102. The trigger generator 603 is coupled to the Power Control from the processor 102, the current sampler 600, the voltage sampler 601 and the interval timer 602. The interval timer 602 receives inputs from the voltage sampler 601 and trigger generator 603 and provides time interval measurements to the processor 102. It is understood that the components of the measuring circuit 108 can be combined or rearranged to provide equivalent functionality.

In operation, the current sampler 600 measures current on at least one wire pair and in either voltage polarity, the voltage sampler 601 measures voltage on at least one wire pair and in either voltage polarity, the trigger generator 603 initiates sample collection based on the DC power source 104 configuration 603 and power controls from the processor 102. The interval timer 602 measures voltage change between predetermined voltage levels 602 over configurable time periods and provides these measurement to the processor 102. The current sampler 600 provides nearly instantaneous and continuous measurements of electrical current flowing out to the EPD 110 through the coupling circuit 107. The current measurements 620 produced are one form of measurements 122 transmitted to the processor 102. The electrical current to the EPD 110 is one characteristic of DC Power 120. In one embodiment of the measuring circuit 108, the current sampler 600 comprises a sense resistance and a precision A/D converter. In another embodiment, the current sampler 600 is configured to measure a resistive detection signature of the Ethernet powered device or a classification signature of the Ethernet powered device. Other embodiments of the current sampler 600 are possible as is known in the art. In one embodiment of the measuring circuit 108 where the EPD 110 is an IEEE 802.3 clause 33 compliant powered device, the current sampler 600 has sensitivity to resolve fractions of milliamps, as may be required when characterizing EPD 110 signatures for detection. Embodiments include, but are not limited to measuring a current range between about zero mA and at least about 350 mA. No particular upper bound for current measurements 620 is implied by this range.

The voltage sampler 601 provides nearly instantaneous and continuous measurements of voltage provided to the EPD 110 via the first interface 106. The voltage measurements 621 produced are one form of measurements 122 transmitted to the processor 102. The voltage to the EPD 110 is a second characteristic of DC Power 120. Voltage may be sensed downstream of the current sampler 600 in order to closely represent the actual voltage incident to the EPD 110 on the Ethernet cable 109. In one embodiment of the DPD 100, resistive characteristics of the coupling interface 107 within the first interface 106 are negligible and resistive characteristics of the Ethernet cable 109 are negligible so that DC Power 120 sampling by the voltage sampler 601 is a nearly ideal representation of voltage appearing at the EPD 110 interface. Other possible embodiments of the DPD 100 may establish voltage detection further downstream within, or beyond, the coupling circuit 107 as a means to overcome resistive losses in circuit paths and coupling circuit 107 elements. In an embodiment of the measuring circuit 108 where the EPD 110 is an IEEE 802.3 clause 33 compliant powered device, the voltage sampler 601 has, for example, a sensitivity to resolve tenths of a volt. Embodiments include, but are not limited to measuring a voltage range between about zero and at least 60 VDC. No particular upper bound for voltage measurements 621 is implied by this range.

In one embodiment, the measuring circuit 108 includes the trigger generator 603 that responds to power control 121 messages from the processor 102 in order to initiate measurements in at least one of the current sampler 600, voltage sampler 601, and interval timer 602. This function enables measurements of current and voltage to be synchronized to changes in the state of the DC power source 104. Alternatively, the current and voltage measurements are initiated by the processor 102 without corresponding changes in the state of the DC power source 104. In one embodiment triggered current measurements 620 are gathered immediately following changes in DC Voltages 127 in order to assess relationship between voltage and current characteristics of DC power 120 fed to the EPD 110. In another embodiment, triggered current measurements 620 are taken immediately following initial operating voltage application to the EPD 110 in order to evaluate input surge current level of the EPD 110.

In one embodiment, the measuring circuit 108 includes the interval timer 602 may to measure time interval measurements 622 to be included with other measurement data transmitted to the processor 102 for analysis. The interval timer 602 measures at least one of time difference between a voltage transition appearing in voltage measurements 621 and a time difference between a trigger 623 and a predetermined voltage level appearing in voltage measurements 621. In one embodiment, where the DPD 100 measures input capacitance of an EPD 110, the interval timer 602 measures the voltage slew time between two predetermined voltage levels wherein the slew time is subsequently processed into a measurement of EPD 110 input capacitance given knowledge of other EPD 110 characteristics. In another embodiment of the measuring circuit 108 where the EPD 110 is an IEEE 802.3 clause 33 compliant powered device, the interval timer 602 has sensitivity to resolve microseconds of time evaluating voltage transitions that are within the detection voltage range of the EPD 110. In yet another embodiment, the measuring circuit 108 operates in conjunction with the DC power source 104 to characterize EPD 110 power signatures for detection and classification. This embodiment is particularly relevant to embodiments of the DPD 100 where the EPD 110 is an IEEE 802.3 clause 33 compliant powered device. The EPD 110 presents a resistive detection signature that signifies to an Ethernet power source that the EPD 110 requires DC power. In one embodiment of the DPD 100, the resistive detection signature is measured by applying at least two different voltages sequentially and then analyzing the associated two current measurements 620. In a second embodiment of the DPD 100, the resistive detection signature is measured by applying at least two different current levels sequentially and then analyzing the associated two voltage measurements 621. IEEE 802.3 clause 33 requires that detection signatures measure in the vicinity of 25 kohm with voltage steps restricted to the band between 2.8V and 10V.

The classification signature associated with the EPD 110 is measured by applying a fixed voltage and then measuring a current draw from the EPD 110. When evaluating IEEE 802.3 clause 33 compliant powered devices, the source voltage appearing in DC power 120 is generally in the band between 14.5V and 20.5V and the range of current measurements 620 is 0 mA to at least about 50 mA. In embodiments for evaluating these compliant devices, use of the power control 121 and the trigger generator 603 may assist in the time coordination of signature measurements relative to changes in DC voltages 127.

Figure 7:
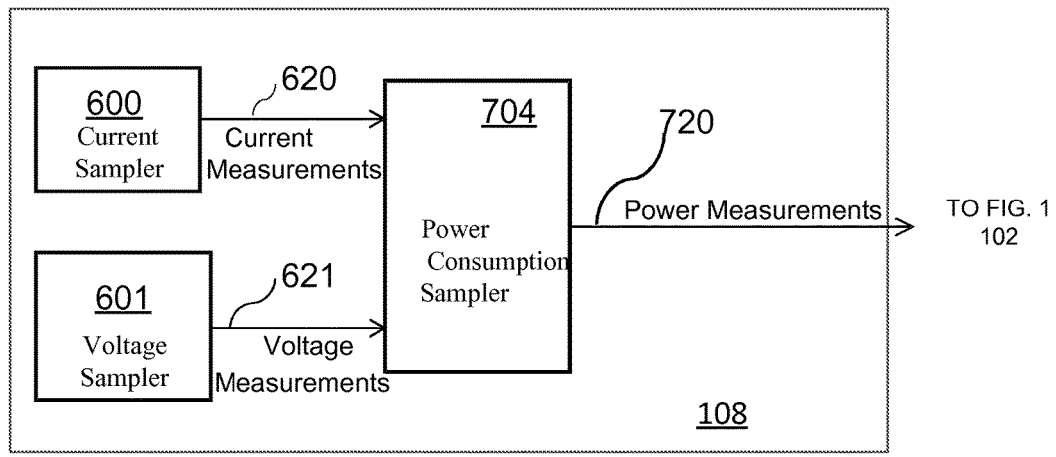
FIG. 7 is a block diagram of voltage, current and power measuring circuits of the apparatus of FIG. 1.

FIG. 7 shows additional components of the measuring circuit 108 which includes a power consumption sampler 704 coupled to both a current sampler 600 and a voltage sampler 601. In operation, the power consumption sampler 704 combines current measurements 620 from the current sampler 600 and voltage measurements 621 from the voltage sampler 601 into power measurements 720. In one embodiment of the measurement of power, power measurements 720 are derived from current measurements 620 and voltage measurements 621 that are simultaneously produced. In another embodiment of the measurement of power, current measurements 620 and voltage measurements 621 are alternated in time producing one power measurement sample per one sample of current followed by one sample of voltage. Other embodiments of the measurement of power given current measurements 620 and voltage measurements 621, including the use of voltage source settings as a substitute for voltage measurements 621, are possible and deemed within the scope of logic for measuring power consumption samples 704. In an embodiment of the DPD 100 where the EPD 110 is an IEEE 802.3 clause 33 compliant powered device, power measurements 720 will range from 0 to at least 13 watts and possibly up to 100 watts.

Figure 8:
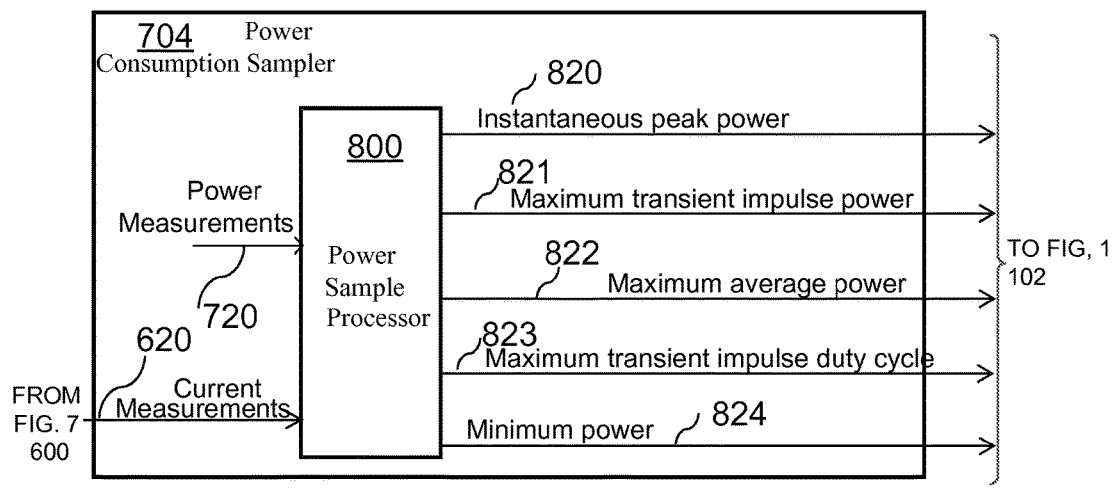
FIG. 8 is a block diagram of a power sample processor of the apparatus of FIG. 1.

In FIG. 8, an exemplary power consumption sampler 704 includes a power sample processor 800. The power sample processor 800 processes power measurements 720 derived in the power consumption sampler 704 and current measurements 620 to provide several measurements of interest in the analysis of EPD 110 electrical behaviors. Current measurements 620 are used to test a minimum power limit in the IEEE standard that is based upon current instead of power. Measurements including power measurements 720, voltage measurements 621 and current measurements 620 can be measured instantaneously, measured continuously with a fixed interval or correlated with an operational or network event. These measurements include but are not limited to, an instantaneous peak power 820, maximum transient impulse power 821, maximum average power 822, maximum transient impulse duty cycle 823 and minimum power 824.

In operation, the power sample processor 800:
compares instantaneous peak power 820 samples to negotiated or authorized levels for maximum instantaneous power draw by the EPD 110;

compares contiguous groupings of maximum transient impulse power 821 samples to the negotiated, or authorized, level for maximum transient impulse power consumption;

accumulates a running average of power consumption and compares the maximum average power 822 to the negotiated, or authorized, level for average power consumption;

evaluates, a stream of power measurement samples is evaluated over time to determine if maximum transient impulse duty cycle 823 impulses exceed the maximum level for average power consumption occur with at a rate that exceeds a maximum allowed duty cycle, or frequency; and assesses the minimum power 824 draw by the EPD 110 to see if there is a risk that the EPD 110 could cause a power source to falsely determine that the EPD 110 is disconnected and should have operation voltage removed.

In one embodiment, power sample processor is logic is executed within the processor 102. In another embodiment, power measurements 720 are transmitted by the processor 102 to the computer 111 using the management interface 125. In this embodiment, the power consumption computations are performed to produce the measurements, 820-824, by the computer 111. The data transmission can be performed in real time or alternatively, power measurements 720 may be stored and batched processed at a later time by the computer 111. Other embodiments of the DPD 100 may implement the power sample processor as circuitry that produces one or more of the five measurements 820-824.

In an embodiment of the DPD 100 where the EPD 110 is an IEEE 802.3 clause 33 compliant powered device, each of these measurements is explained with respect to documented parameters in the aforementioned 802.3 specification. The instantaneous peak power 820 measurement evaluates EPD 110 power draw relative to the upper limit for Ppeak_powered device (pd) that is authorized by a power negotiation. The maximum transient impulse power 821 measurement evaluates EPD 110 power draw relative to both the upper limit for Pclass_pd, as established by a power negotiation, and also to the upper limit for the maximum overcurrent duration (Tcut). The maximum average power measurement 822 compares one second duration running averages of EPD 110 power draw relative to the upper limit for Pclass power draw as established by a power negotiation. The maximum transient impulse duty cycle measurement 823 evaluates EPD 110 power draw to determine if transient impulses exceeding Pclass power draw occur at a frequency exceeding 5% of samples evaluated. The minimum power measurement 824 analyzes current measurements 620 to determine if load current exceeds 10 mA for at least 75 milliseconds of each 325 millisecond time interval. In the above description it is understood that the various measurement and processing functions can reside in the processor 102, hardware, or as software distributed to one or more additional processors.

Figure 9:
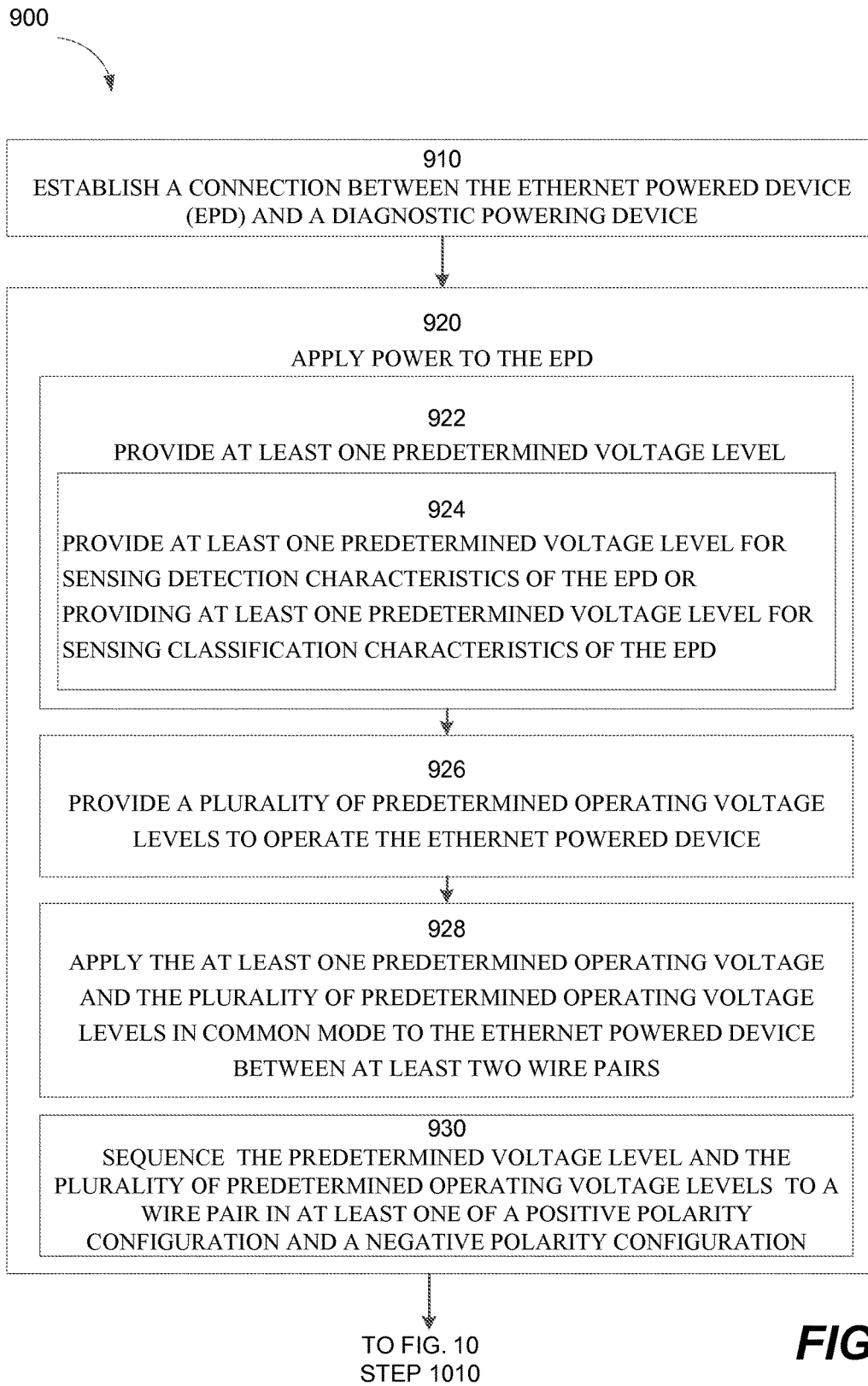
FIGS. 9-12 are flow diagrams illustrating example processes according to embodiments disclosed herein.

Now referring to FIG. 9, a flow diagram 900 details a process for testing an Ethernet powered device (EPD) 110 utilizing the DPD 100 and the remote network device 112. Measurements, tests and evaluation procedures disclosed herein, include, but are not limited to, protocol negotiation, and power consumption of Ethernet powered devices. Measurements also include detection, and classification parameter tests, and conformance testing of operating parameters defined in clause 33 section of the IEEE 802.3 standard. In step 910, a connection is established between the EPD 110 and the DPD 100. In one embodiment this is established using an Ethernet cable. In this arrangement, the DPD 100 is the testing instrument and the EPD 110 is the device-under-test. In an embodiment of a DPD that tests an IEEE 802.3 clause 33 compliant EPD, the DPD 100 includes the detection, classification, powering, and link layer power negotiation capabilities attributable to Ethernet Power Sourcing Equipment and includes flexible control of each of these capabilities. Additionally, the DPD 100 includes electrical measurement features supporting analysis of electrical characteristics of the EPD 110, in particular, those characteristics that are described by specifications in the IEEE standard. In one embodiment, the DPD 100 includes packet forwarding abilities similar to an Ethernet switch. The EPD 110 is generally a device designed to receive operating power from the same electrical connection used for data communications. Cables used for interconnection can be Ethernet cable, other cables specified for use with Ethernet, cables specified in the ANSI/TIA/EIA-568 standard or other cables including modified cables capable of providing transfer of Ethernet communications and power.

Power is applied by the DPD 100 to the EPD 110 in step 920. In step 922, at least one predetermined voltage level is generated. Power is provided to the EPD in a form that includes at least one of; a static DC voltage, a sequence of changing DC voltages, a DC voltage that develops in response to a fixed DC current. Then that voltage is applied in a common mode configuration across one or more of the wire pairs in an Ethernet cable in step 22. In an embodiment where the Ethernet cable is described by the ANSI/TIA/EIA-568 standard, there are typically four twisted wire pairs and DC current is fed through either one or two of those twisted pairs to the EPD while DC current is returned through either one or two different twisted pairs from the EPD. For a given wire pair, applying one voltage to both wires constitutes a Common Mode connection (as opposed to positive on one wire and negative on the other, which would be a differential connection with respect to the wire pair). For compliance testing, each common mode configuration allowed in the IEEE standard can be tested for detection, classification, and powered operation.

In step 924, the predetermined voltage level is provided for sensing detection characteristics of the EPD and/or sensing classification characteristics of the Ethernet Powered Device or operating the EPD. In step 926, a plurality of predetermined operating voltage levels to operate the Ethernet Powered Device are provided. In step 928 the at least one predetermined operating voltage and the plurality of predetermined operating voltage levels are applied in common mode to the Ethernet powered device between at least two wire pairs, and in step 930, the predetermined voltage level may be sequenced to a wire pair in at least one of a positive polarity configuration and a negative polarity configuration. The plurality of predetermined operating voltage levels are also sequenced to a wire pair in at least one of a positive polarity configuration and a negative polarity configuration.

In an embodiment where the Ethernet cable is described by the ANSI/TIA/EIA-568 standard, there are typically four twisted wire pairs and DC current is fed through either one or two of those twisted pairs to the EPD while DC current is returned through either one or two different twisted pairs from the EPD. In one embodiment, the DPD may negotiate an allocated power level with the EPD and allow the EPD to draw more than the allocated power level to facilitate failure analysis.

Figure 12:
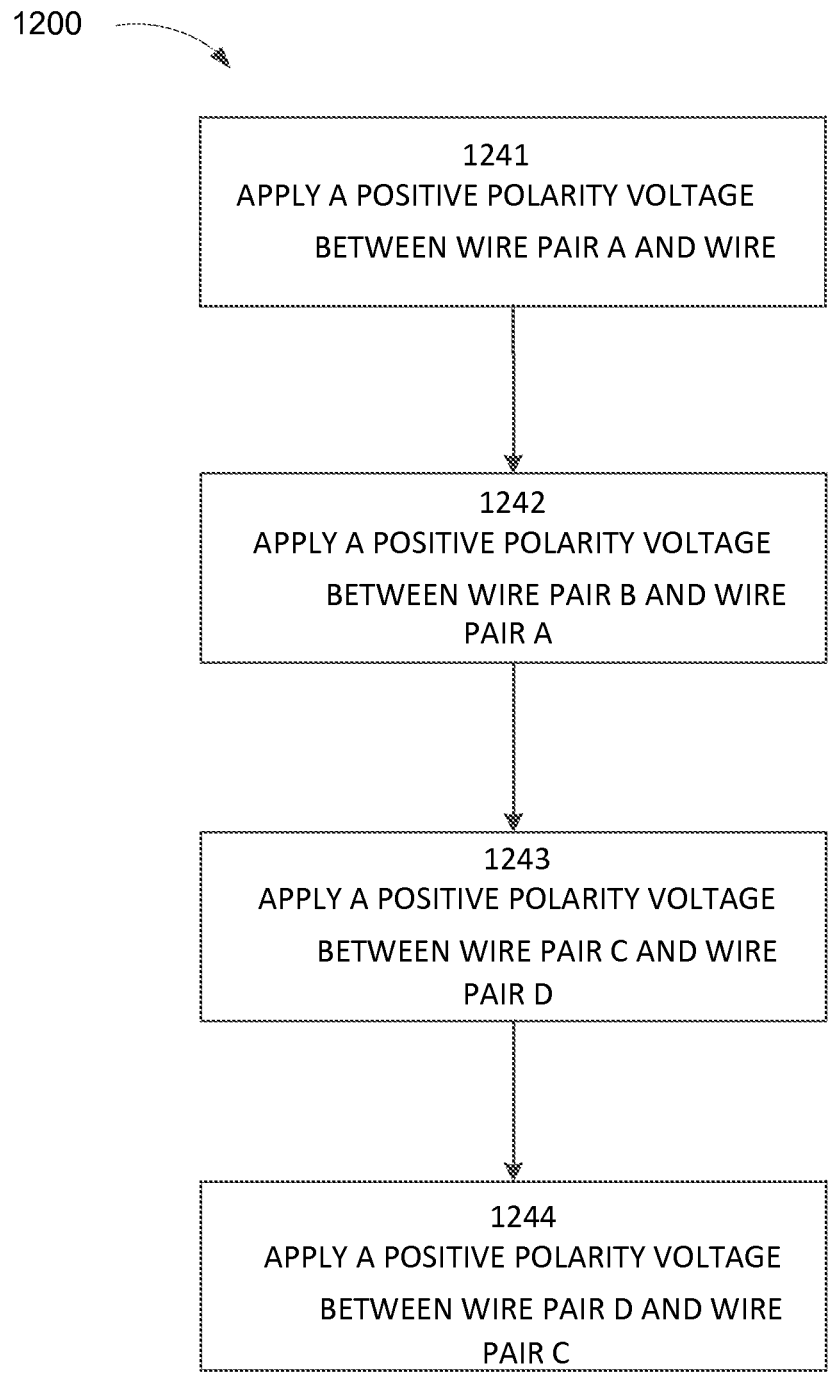

Now referring to FIG. 12, an EPD may receive power over any two of the four twisted wire pairs. Alternatively, an EPD may receive power over all four twisted wire pairs. Voltage levels applied in common mode between twisted-wire pairs may be applied in either voltage polarity. Using twisted pair identifiers a, b, c, and d, the process of measuring an EPD for compliance may include applying voltage levels in a common mode configuration to one or more wire pairs comprises sequencing four steps; first, a positive polarity voltage is applied between wire pair a and wire pair b in step 1241, then polarity is reversed so that pair b is positive relative to pair a in step 1242, next a positive polarity voltage is applied between wire pair c and wire pair d in step 1243, and finally polarity is reversed so that pair d is positive with respect to pair c in step 1244. In an embodiment where all four pairs are used for powering the EPD, steps 1241 and 1243 may be performed together followed by steps 1242 and 1244 also performed together. In one embodiment, measurements are performed for each sequenced common mode configuration.

Figure 10:
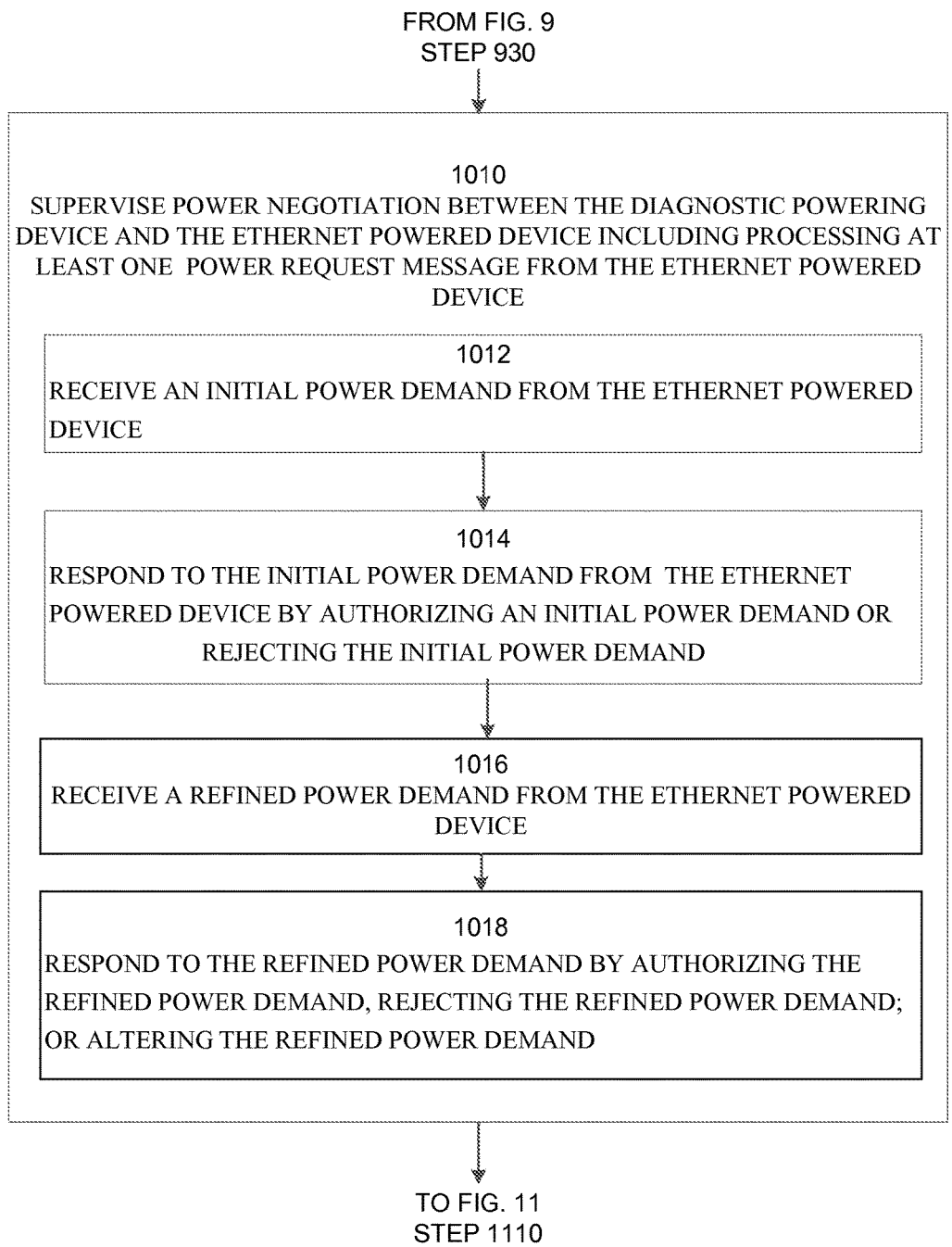

Now referring to FIG. 10, a flow diagram 1000 further details a process for testing an EPD 110 utilizing the DPD 100 and the remote network device 112. In step 1010, power negotiation between the diagnostic powering device and the Ethernet powered device is supervised by the power negotiation supervisor 114. The supervision includes processing at least one power request message from the EPD 110. In step 1012, an initial power demand is received from the Ethernet powered device. In an embodiment of an IEEE 802.3 clause 33 compliant EPD, the initial demand is conveyed as an electrical current value sensed by the power source at a predetermined voltage level. The power source can then deny this request by simply not providing an operating voltage to the EPD. Alternatively, in this same embodiment, the power source can provide a timed sequence of current measurements and then provide operating voltage as a signal to fully authorize the initial power request. The power source may also skip the timed sequence of current measurements and provide an operating voltage as a signal that the EPD is authorized for only a portion of its initial power demand. The DPD 100 is an example of the power source described in this process.

In step 1014, the DPD 100 responds to the initial power demand from the Ethernet powered device by either authorizing an initial power demand or rejecting the initial power demand. If the initial power demand is rejected, the DPD 100 receives a refined power demand from the EPD 110 in step 1016. In response to the refined power demand the DPD takes one of the following actions in step 1018: authorizing the refined power demand, rejecting the refined power demand or altering the refined power demand. The actions of the EPD 110 including the negotiation protocol messages and the actual power usage are correlated in the power negotiation supervisor 114 and correlated with the power consumption measurements described below in conjunction with FIG. 11. In one embodiment the DPD 100 reports test results through the management interface 125 or may provide the results on an indicator on the DPD 100. The results may be provided as described above in conjunction with the description of FIG. 1.

Figure 11:
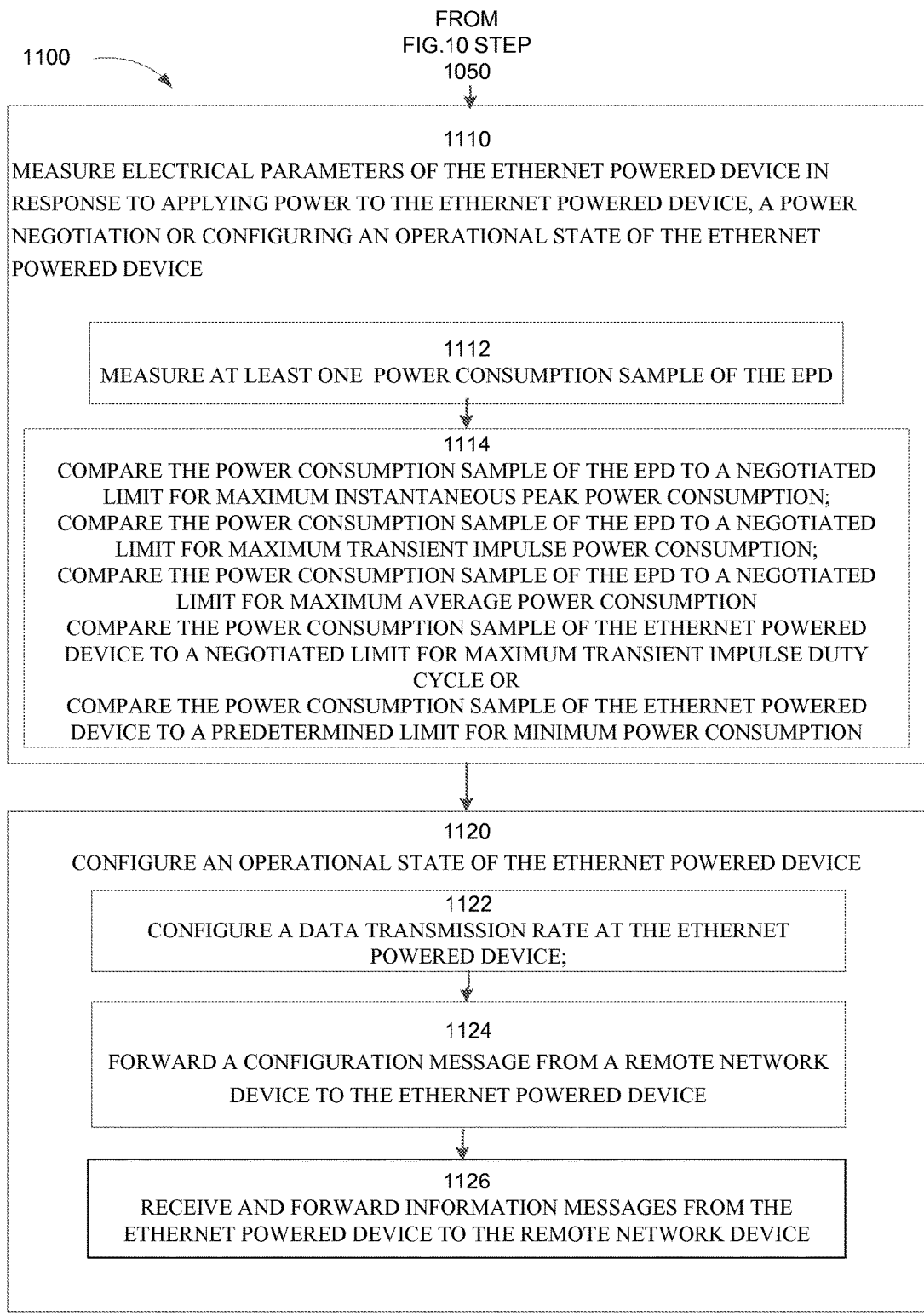

Now referring to FIG. 11, a flow diagram 1100 further details a process for testing an Ethernet powered device (EPD) 110 including measuring and monitoring electrical parameters of an EPD 110. Other parameters such as detection resistance, detection capacitance can be derived from parameters including one or more of voltage, current, event and/or interval timing, and other timed measurements. In step 1110, electrical parameters of the Ethernet powered device are measured in response to applying power to the Ethernet powered device, a power negotiation or configuring the operational state of an EPD. Discrete measurements and ongoing parameter monitoring are carried out to assess responses of the EPD to particular stimuli.

In one embodiment, in a power negotiation, the DPD 100 directs the EPD 110 to consume less power and in response to this power negotiation, the DPD measures electrical parameters to determine that the EPD 110 has actually reduced the power consumption to the negotiated level. If the measured power consumption does not decrease then the DPD 100 can report a fault or otherwise indicate a failure.

Measured parameters include at least one of voltage, current, power, resistance, capacitance, and time interval. A first type of stimulus is providing power as described above. It is understood that individual measurement can be made, parameters can be monitored (i.e., measurements can made over time intervals) and measurements can be stored for later processing and evaluation.

Another type of stimulus includes a link layer power negotiation protocol conducted with the EPD. In the embodiment of a DPD that tests an IEEE 802.3 clause 33 compliant EPD, the power negotiation takes place at any time following the application of operating power to the EPD. Using the power negotiation protocol, the EPD 110 issue requests to be allocated a predetermined amount of power and an Ethernet powering device, here the DPD 100, will acknowledge those requests and may choose to provide or deny those power allocations. The EPD 110 is then bound to operate within a range of power consumption that is limited by the allocation provided. Therefore, the DPD 100 is supervising the power negotiation.

In step 1112, a power consumption sample of the EPD is measured. A power consumption measurement include a direct measurement of power in units of watts, which may be derived from combined measurements of voltage in units of volts and current in units of amps whereby power consumption is the product of voltage and current. The term "samples," as used herein, generally refers to one or more discrete measurements that are performed at some periodic rate. As measurement samples are collected, analysis compares each measurement sample to the negotiated, or authorized, levels. In step 1114, several comparisons are made including:

comparing the power consumption sample of the Ethernet powered device to a negotiated limit for maximum instantaneous peak power consumption;

comparing the power consumption sample of the Ethernet powered device to a negotiated limit for maximum transient impulse power consumption. In this analysis, a contiguous group of measurement samples over a short time interval are compared to an allowable maximum transient power limit. In an 802.3 clause 33 compliant EPD embodiment, a transient load impulse exceeding the maximum authorized average power consumption is allowable for a maximum of 50 milliseconds.

comparing the power consumption sample of the Ethernet powered device to a negotiated limit for maximum average power consumption (In an embodiment of testing an 802.3 clause 33 compliant EPD, this measurement interval is one second), comparing the power consumption sample of the Ethernet powered device to a negotiated limit for maximum transient impulse duty cycle, here a series of samples are evaluated over time to determine if transient impulses exceeding the maximum average power level occur with at a rate that exceeds a maximum allowed duty cycle, or frequency; and comparing the power consumption sample of the Ethernet powered device to a predetermined limit for minimum power consumption (in the embodiment of testing an 802.3 clause 33 compliant EPD, the EPD is required to exceed 10 mA of load current draw for at least 75 millisecond of each 325 millisecond time interval. In this embodiment, the applied operating voltage may be utilized to convert the 10 mA load current into an equivalent power draw).

Steps 1120-1126 illustrate an embodiment of the process of configuring the operational state of an EPD after the EPD has received an operating voltage. In step 1120, an operational state of the Ethernet powered device is configured. In step 1122, the data transmission rate at the Ethernet powered device is configured. In step 1124, a configuration message is forwarded from a remote network device to the EPD 110. In step 1126, information messages are received from the EPD 110 and forwarded device to the remote network device. In certain embodiments, the remote network device 112 is used to communicate with the EPD 110 to simplify the operation of the DPD 100. The remote network device is used to operate the EPD 110 and also to provide additional network traffic. During initial link-up, the EPD responds to physical layer signaling from the DPD to configure the communication link data rate. In an Ethernet 802.3 Base-T embodiment of this process, auto-negotiation is configured to allow the EPD to operate at a negotiated data rate that includes at least one of 10Base-T, 100Base-Tx, and 1000Base-T. This configuration will affect power consumption of the EPD. In operation, the EPD 110 receives commands or configuration messages from a remote network device 112. These commands or configuration messages affect power consumption of the EPD. In one example, the EPD 110 is a pan-zoom-tilt IP camera and receives commands to activate motors to adjust camera position that in turn creates an elevated power consumption level temporarily. In practice, remote network devices that manage the operational state of the EPD also recover information from the EPD in the form of messages conveying status of the EPD. In the IP camera example, image feedback from the IP camera or commands from the remote network device 112 can cause changes in power consumption and can prompt power negotiation message traffic. The DPD 100 can correlate such activity to detect proper operation of the EPD 110.

It will be apparent to those skilled in the art that various changes and modifications may be implemented which fall within the spirit of the invention. The embodiments and examples described herein should be considered exemplary and not restrictive or limiting, and that the scope of the method and system described herein is determined by the appended claims and their equivalents.

It is understood, that the embodiments described above can be implemented as a standalone instrument performing individual tests, a combined test instrument performing multiple tests or a test system.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs including computer readable instructions that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular data types. Typically the functionality of the program modules may be combined or distributed as desired in various embodiments. Aforementioned examples are not exhaustive, and are for illustration and not limitation.

The computer program(s) may be implemented using one or more high level procedural or object-oriented programming languages to communicate with a computer system; however, the program(s) may be implemented in assembly or machine language, if desired. The language may be compiled or interpreted.

As provided herein, the processor(s) may thus be embedded in one or more devices that may be operated independently or together in a networked environment, where the network may include, for example, a Local Area Network (LAN), wide area network (WAN), and/or may include an intranet and/or the internet and/or another network. The network(s) may be wired or wireless or a combination thereof and may use one or more communications protocols to facilitate communications between the different processors. The processors may be configured for distributed processing and may utilize, in some embodiments, a client-server model as needed. Accordingly, the methods and systems may utilize multiple processors and/or processor devices, and the processor instructions may be divided amongst such single- or multiple-processor/devices.

The device(s) or computer systems that integrate with the processor(s) may include, for example, a personal computer(s), workstation(s) (e.g., Sun, HP), personal digital assistant(s) (PDA(s)), handheld device(s) such as cellular telephone(s), laptop(s), handheld computer(s), or another device(s) capable of being integrated with a processor(s) that may operate as provided herein. Accordingly, the devices provided herein are not exhaustive and are provided for illustration and not limitation.

References to "a microcontroller," or "the microcontroller," may be understood to include one or more microprocessors that may communicate in a stand-alone and/or a distributed environment(s), and may thus be configured to communicate via wired or wireless communications with other processors, where such one or more processor may be configured to operate on one or more processor-controlled devices that may be similar or different devices. Use of such "processor" terminology may thus also be understood to include a central processing unit, an arithmetic logic unit, an application-specific integrated circuit (IC), and/or a task engine, with such examples provided for illustration and not limitation.

Furthermore, references to memory, unless otherwise specified, may include one or more processor-readable and accessible memory elements and/or components that may be internal to the processor-controlled device, external to the processor-controlled device, and/or may be accessed via a wired or wireless network using a variety of communications protocols, and unless otherwise specified, may be arranged to include a combination of external and internal memory devices, where such memory may be contiguous and/or partitioned based on the application.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein. Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A method for testing an Ethernet powered device comprising;
    establishing a connection between the Ethernet powered device (EPD) and a diagnostic powering device (DPD);
    applying power to the Ethernet powered device comprising:
        applying at least one predetermined voltage level to sense detection and classification characteristics of the Ethernet powered device; and
        applying a plurality of predetermined operating voltage levels to operate the Ethernet powered device;
    supervising a power negotiation between the diagnostic powering device and the Ethernet powered device, the power negotiation supervision comprising:
    sensing an initial power demand of the Ethernet powered device;
        responding to the initial power demand with an initial power authorization;
        receiving at least one link layer refined power demand message from the Ethernet powered device after an operational voltage has been applied to the Ethernet powered device;
    measuring at least one electrical parameter of the Ethernet powered device following the application of operating power in response to at least one of:
        applying a plurality of predetermined operating voltage levels to operate the Ethernet powered device including applying at the output of the DPD a minimum operating input voltage required to operate the Ethernet powered device;
        and
        configuring an operational state of the Ethernet powered device via a remote network device and correlating the operational state with power consumption of the Ethernet powered device to detect proper operation of the EPD.

2. The method of claim 1, wherein applying at least one predetermined voltage level comprises applying the at least one predetermined voltage level in common mode to the Ethernet powered device between at least two wire pairs; and
    wherein applying a plurality of predetermined operating voltage levels to operate the Ethernet Powered Device comprises applying the plurality of predetermined operating voltage levels in common mode to the Ethernet powered device between at least two wire pairs.

3. The method of claim 1, further comprising applying the plurality of predetermined operating voltage levels to a wire pair in a positive polarity configuration and a negative polarity configuration.

4. The method of claim 1, wherein supervising the power negotiation comprises:
    receiving an initial power demand from the Ethernet powered device;
    responding to the initial power demand from the Ethernet powered device by one of:
        authorizing an initial power demand with a timed sequence of current measurements; and
        rejecting the initial power demand;
    receiving the link layer refined power demand from the Ethernet powered device after applying an operational voltage level to the Ethernet powered device; and
    responding to the refined power demand by one of:
        authorizing the link layer refined power demand
        rejecting the link layer refined power demand; and
        altering the link layer refined power demand.

5. The method of claim 1, wherein configuring the operational state of the Ethernet powered device comprises:
    configuring a data transmission rate at the Ethernet powered device;
    forwarding a configuration message from the remote network device to the Ethernet powered device; and
    receiving and forwarding information messages from the Ethernet powered device to the remote network device.

6. The method of claim 1, wherein measuring the at least one electrical parameter includes measuring at least one power consumption sample of the Ethernet powered device; the method further comprising at least one of:
    comparing the power consumption sample of the Ethernet powered device to a negotiated limit for maximum instantaneous peak power consumption;
    comparing the power consumption sample of the Ethernet powered device to a negotiated limit for maximum transient impulse power consumption;
    comparing the power consumption sample of the Ethernet powered device to a negotiated limit for maximum average power consumption;

comparing the power consumption sample of the Ethernet powered device to a negotiated limit for maximum transient impulse duty cycle; and comparing the power consumption sample of the Ethernet powered device to a predetermined limit for minimum power consumption.

7. The method of claim 1, wherein the minimum voltage supplied by the DPD required to operate the Ethernet powered device is less than about 44V.

8. The method of claim 1, wherein the minimum voltage required to operate the Ethernet powered device is applied by the DPD to the EPD through a cable and coupling interface connection having at least one known electrical characteristic.

9. The method of claim 8, wherein the at least one known electrical characteristic is negligible resistance.

10. A diagnostic powering device (DPD) apparatus for testing an Ethernet powered device (EPD) comprising:
a processor including a power negotiation supervisor;
a configurable DC power source controllably coupled to the processor;
a first bridging circuit coupled between the processor and a first interface, the first interface comprising:
an Ethernet medium dependent interface connectable to the EPD; and
a coupling circuit that inserts DC power onto one or more wire pairs of the first interface;
a second bridging circuit coupled between the first interface and a second interface, the second interface comprising an Ethernet medium dependent interface;
wherein the second bridging circuit:
transfers configuration messages from a remote network device to the Ethernet powered device;
transfers information messages from the Ethernet powered device to the remote network device; and
wherein the remote network device controls at least one operational state of the Ethernet powered device;
a measuring circuit coupled to the processor to measure characteristics of DC power consumed by the EPD through the first interface;
wherein the measuring circuit measures at least one electrical parameter of the Ethernet powered device following the application of operating power in response to at least one of:
applying a plurality of predetermined operating voltage levels to operate the Ethernet powered device including applying at the output of the DPD a minimum operating input voltage required to operate the Ethernet powered device; and
configuring an operational state of the Ethernet powered device via a remote network device and correlating the operational state with power consumption of the Ethernet powered device to detect proper operation of the EPD;
wherein the configurable DC power source is configurable over a range of voltage levels including a minimum input voltage required to operate the EPD applied at the first interface;
wherein the power negotiation supervisor generates Ethernet messages associated with a link layer power negotiation protocol and decodes Ethernet messages associated with the link layer power negotiation protocol; and
wherein the power negotiation supervisor supervises a power negotiation between the diagnostic powering device and the Ethernet powered device, the power negotiation supervision comprising:

sensing an initial power demand of the EPD;
responding to the initial power demand with an initial power authorization; and
receiving at least one link layer refined power demand message from the EPD after an operational voltage has been applied to the EPD.

11. The apparatus of claim 10, wherein the first interface comprises an Ethernet PHY; and wherein the processor configures a link data rate of the Ethernet powered device.

12. The apparatus of claim 10, wherein the coupling circuit connects configurable DC power in at least one of a positive polarity and a negative polarity to at least one wire pair with reference to at least a second wire pair.

13. The apparatus of claim 10, wherein the first bridging circuit separates at least one Power-over-Ethernet link layer negotiation message from LAN traffic between the Ethernet powered device and the second interface.

14. The apparatus of claim 10, wherein the first bridging circuit:
transfers at least one protocol message from the processor to the Ethernet powered device;
transfers the at least one protocol message from the Ethernet powered device to the processor; and
wherein the at least one protocol message is utilized to supervise DC power consumption of the Ethernet powered device.

15. The apparatus of claim 10, wherein the measuring circuit comprises at least one of:
a current sampler coupled to at least one wire pair and in at least one voltage polarity;
a voltage sampler coupled to on at least one wire pair and in at least one voltage polarity;
a circuit for initiating sample collection based on the DC power source configuration; and
an interval timer to measure an interval of a voltage change between predetermined voltage levels.

16. The apparatus of claim 15, wherein the current sampler is configured to measure:
a resistive detection signature of the Ethernet powered device; and
a classification signature of the Ethernet powered device.

17. The apparatus of claim 15 further comprising a power consumption sampler coupled to the current sampler to receive at least one current sample and coupled to the voltage sampler to receive at least one voltage sample.

18. The apparatus of claim 17, wherein the power consumption sampler comprises a power sample processor; and
wherein the power sample processor generates from the at least one current sample and the at least one voltage sample at least one of:
a maximum instantaneous peak power consumption;
a maximum transient impulse power consumption;
a maximum and minimum average power consumption;
a maximum transient impulse duty cycle; and
a minimum power.

19. The apparatus of claim 10, wherein the power negotiation supervisor configures at least one link layer Ethernet message that deviates from valid power negotiation protocols in at least one of:
message content; and
message timing.

20. A non-transitory computer readable storage medium for tangibly storing thereon computer readable instructions for a method to test an Ethernet powered device when executed on a processor, the method comprising:
establishing a connection between the Ethernet powered device and a diagnostic powering device;

applying power to the Ethernet powered device comprising:
  applying at least one predetermined voltage level to sense detection and classification characteristics of the Ethernet powered device; and
  applying a plurality of predetermined operating voltage levels to operate the Ethernet powered device;
supervising a power negotiation between the diagnostic powering device and the Ethernet powered device, the power negotiation supervision comprising:
sensing an initial power demand of the Ethernet powered device;
  responding to the initial power demand with an initial power authorization;
receiving at least one link layer refined power demand message from the Ethernet powered device after an operational voltage has been applied to the Ethernet powered device;
measuring at least one electrical parameter of the Ethernet powered device following the application of operating power in response to at least one of:
  applying a plurality of predetermined operating voltage levels to operate the Ethernet powered device including applying at the output of the DPD a minimum operating input voltage required to operate the Ethernet powered device;
  and
  configuring an operational state of the Ethernet powered device via a remote network device and correlating the operational state with power consumption of the Ethernet powered device to detect proper operation of the EPD.

* * * * *